(12) United States Patent
Xu et al.

(10) Patent No.: US 11,118,268 B2
(45) Date of Patent: Sep. 14, 2021

(54) METHOD FOR REDUCING SURFACE ROUGHNESS

(71) Applicant: GENERAL ELECTRIC COMPANY, Schenectady, NY (US)

(72) Inventors: Wusheng Xu, Haikou (CN); Laura Cerully Dial, Niskayuna, NY (US); Lawrence Bernard Kool, Niskayuna, NY (US); Dalong Zhong, Niskayuna, NY (US); Hong Zhou, Shanghai (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/205,926

(22) Filed: Nov. 30, 2018

(65) Prior Publication Data

US 2019/0169753 A1 Jun. 6, 2019

(30) Foreign Application Priority Data

Dec. 1, 2017 (CN) .......................... 201711250097.1

(51) Int. Cl.
*H01L 21/3213* (2006.01)
*H01L 21/3205* (2006.01)
(Continued)

(52) U.S. Cl.
CPC ............. *C23C 26/00* (2013.01); *B33Y 40/00* (2014.12); *C23C 10/48* (2013.01); *C23C 10/60* (2013.01);
(Continued)

(58) Field of Classification Search
None
See application file for complete search history.

(56) References Cited

U.S. PATENT DOCUMENTS 4,260,654 A * 4/1981 Baldi .................... C08F 283/01
205/191
4,443,557 A 4/1984 Baldi
(Continued)

FOREIGN PATENT DOCUMENTS

CN 103046386 A 4/2013
CN 103046387 A 4/2013
(Continued)

OTHER PUBLICATIONS

Galetz et al.,"Novel processing in inert atmosphere and in air to manufacture high-activity slurry aluminide coatings modified by Pt and Pt/Ir", Materials and Corrosion, vol. 63, Issue: 10, pp. 921-928, Oct. 2012.
(Continued)

*Primary Examiner* — Stephanie P Duclair
(74) *Attorney, Agent, or Firm* — Dority & Manning, P.A.

(57) ABSTRACT

A surface of an article is modified by aluminizing an initial surface at a first temperature to form a first aluminized layer and a sublayer, removing at least a portion of the first aluminized layer, aluminizing the sublayer at a second temperature to form a second aluminized layer, and finally removing at least a portion of the second aluminized layer to form a processed surface. The second temperature is less than the first temperature and a roughness of the processed surface is less than the roughness of the initial surface.

18 Claims, 9 Drawing Sheets

(51) Int. Cl.
*H01L 21/02* (2006.01)
*C23F 1/20* (2006.01)
*C23F 1/16* (2006.01)
*C23F 1/14* (2006.01)
*C23F 1/10* (2006.01)
*C23F 1/00* (2006.01)
*C23C 26/00* (2006.01)
*C23C 10/60* (2006.01)
*C23C 10/48* (2006.01)
*B33Y 40/00* (2020.01)

(52) U.S. Cl.
CPC ............. *C23F 1/00* (2013.01); *C23F 1/10* (2013.01); *C23F 1/14* (2013.01); *C23F 1/16* (2013.01); *C23F 1/20* (2013.01); *H01L 21/02148* (2013.01); *H01L 21/02178* (2013.01); *H01L 21/32056* (2013.01); *H01L 21/32133* (2013.01); *H01L 21/32134* (2013.01)

(56) References Cited

U.S. PATENT DOCUMENTS

| | | | |
|---|---|---|---|
| 5,334,263 A * | 8/1994 | Schaeffer | C23C 12/00 148/217 |
| 5,366,765 A * | 11/1994 | Milaniak | C23C 10/20 427/229 |
| 6,110,262 A * | 8/2000 | Kircher | C23C 10/30 106/14.21 |
| 6,206,973 B1 | 3/2001 | Bailey et al. | |
| 6,758,914 B2 * | 7/2004 | Kool | C23C 10/02 134/28 |
| 7,731,864 B2 | 6/2010 | Feller et al. | |
| 8,668,328 B2 | 3/2014 | Ray et al. | |
| 9,039,917 B2 | 5/2015 | Szuromi et al. | |
| 9,334,806 B2 | 5/2016 | Carter et al. | |
| 9,393,620 B2 | 7/2016 | Bales et al. | |
| 2013/0071562 A1 * | 3/2013 | Szuromi | B22F 3/1055 427/237 |
| 2015/0060403 A1 * | 3/2015 | Carter | F02C 7/30 216/53 |
| 2016/0221146 A1 | 8/2016 | Lugg et al. | |
| 2017/0051389 A1 * | 2/2017 | Dial | C23C 24/08 |

FOREIGN PATENT DOCUMENTS

| | | |
|---|---|---|
| CN | 104172633 A | 12/2014 |
| EP | 0048083 A1 | 3/1982 |
| FR | 2523476 A1 | 9/1983 |
| WO | 2016124432 A1 | 8/2016 |

OTHER PUBLICATIONS

Chinese Office Action Corresponding to Application No. 2017110250098.
Chinese Search Report Corresponding to Application No. 2017110250098.
European Search Report Corresponding to Application No. 18207690 dated Mar. 25, 2019.
Machine Translated Chinese Search Report Corresponding to Application No. 201711250097 dated Aug. 7, 2020.

* cited by examiner

METHOD FOR REDUCING SURFACE ROUGHNESS

BACKGROUND

This disclosure generally relates to methods for fabricating articles. More particularly, this disclosure relates to methods for reducing surface roughness of articles, such as, but not limited to, metal articles formed by additive manufacturing processes.

Manufacturing methods that rely on addition of material to "build" components portion-by-portion, such as layer-by-layer, often suffer from unduly high levels of surface roughness. These high levels of surface roughness are attributable in part to incomplete leveling of surfaces formed, for example, by melted (or partially melted) and solidified powder feed-stocks. Spray-forming and thermal spraying are two such processes used to form coatings or freestanding articles. Additive manufacturing methods are further examples of such processes, and these methods are of particular interest to industry for their potential to fabricate complex three-dimensional parts with reduced cost and increased throughput relative to conventional metalworking processes such as casting and forging. The term "additive manufacturing" is defined by the American Society for Testing and Materials as the "process of joining materials to make objects from three-dimensional model data, usually layer upon layer, as opposed to subtractive manufacturing methodologies, such as traditional machining and casting." Such processes have demonstrated capability to manufacture components with complex features, including, for example, internal channels for facilitating fluid flow, such as for cooling or fluid delivery.

High surface roughness on external surfaces or internal channel walls of components may hinder component functionality where, for example, fluid flow plays a role in the working of the component. For example, turbine airfoil components such as blades and vanes typically specify upper limits for roughness of certain external surfaces to maintain aerodynamics of gas flow within design parameters. Moreover, components that facilitate flow of liquid are typically desired to have flow channels, such as internal flow channels, with channel wall surface roughness below specified limits to promote efficient flow and reduce fouling of channels by debris. Finally, unduly high surface roughness may also detract from mechanical properties of articles. By way of example, high surface roughness may promote fatigue crack initiation in some applications, thereby reducing the life of components relative to those having a smoother surface. Therefore, reduction in surface roughness of some components is desirable.

BRIEF DESCRIPTION

In one aspect, a method for reducing roughness of a surface is provided. The method includes (a) aluminizing an initial surface at a first temperature to form a first aluminized layer and a sublayer, (b) removing at least a portion of the first aluminized layer to expose the sublayer, (c) aluminizing the sublayer at a second temperature to form a second aluminized layer, and (d) removing at least a portion of the second aluminized layer to form a processed surface. The second temperature is less than the first temperature and a roughness of the processed surface is less than the roughness of the initial surface.

In another aspect, a method for reducing roughness of a surface is provided. The method includes (a) coating an initial surface using a first slurry to form a coated surface, (b) heat-treating the coated surface at a first temperature to form a first aluminized layer and a sublayer, (c) removing at least a portion of the first aluminized layer by acid etching to expose the sublayer, (d) coating the sublayer using a second slurry to form a coated sublayer, (e) heat-treating the coated sublayer at a second temperature to form a second aluminized layer, and (d) removing at least a portion of the second aluminized layer by acid etching to form a processed surface. The second temperature is less than the first temperature and a roughness of the processed surface is less than the roughness of the initial surface.

In another aspect, a method is provided. The method includes (a) aluminizing an initial cobalt-rich surface at a temperature greater than 1000 degrees Celsius to form a first aluminized layer and a sublayer, (b) removing at least a portion of the first aluminized layer to expose the sublayer, (c) aluminizing the sublayer at a temperature less than 800 degrees Celsius to form a second aluminized layer, and (d) removing at least a portion of the second aluminized layer to form a processed cobalt-rich surface. A roughness of the processed cobalt-rich surface is less than the roughness of the initial cobalt-rich surface.

DRAWINGS

These and other features, aspects, and advantages of the present invention will become better understood when the following detailed description is read with reference to the accompanying drawing in which like characters represent like parts, wherein.

DETAILED DESCRIPTION

Figure 1:
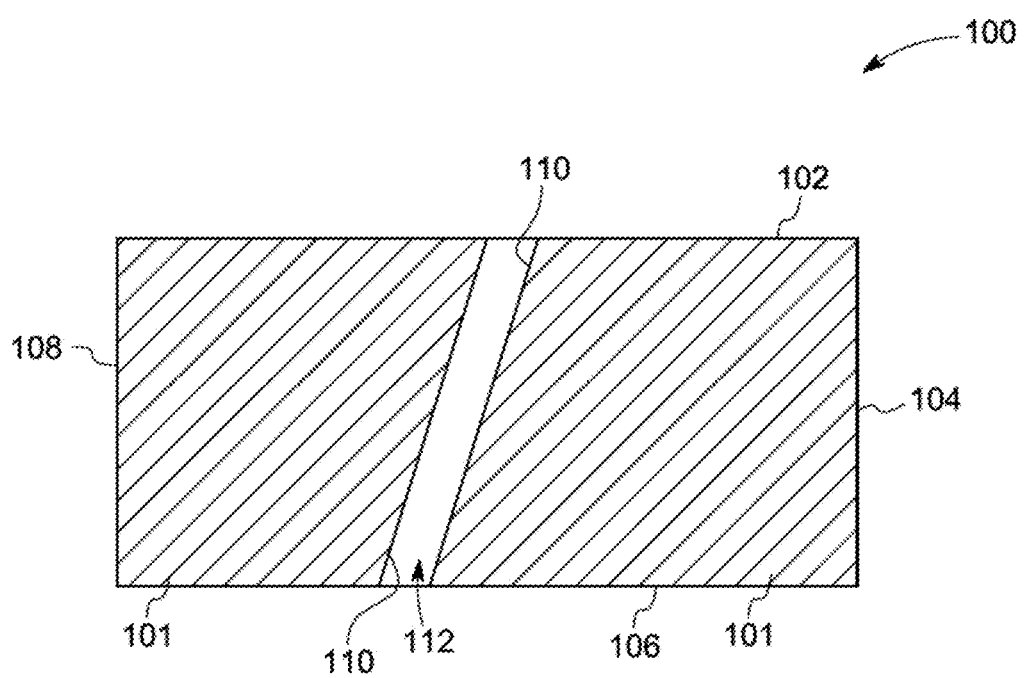
FIG. 1 is a schematic cross-sectional view of an illustrative initial article in accordance with some embodiments of techniques described herein.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

The techniques described herein serve to reduce the surface roughness of articles, regardless of methods of fabrication of these articles. Given the propensity of additive manufacturing methods to produce articles with unduly high surface roughness, emphasis is given in the description below for the applicability of the described methods to improve surface roughness of additively manufactured articles. This emphasis should not be construed as limiting, however, and the more general applicability of the described methods will be apparent to practitioners in the manufacturing arts.

To more clearly and concisely describe and point out the subject matter, the following definitions are provided for specific terms, which are used throughout the following description and the appended claims, unless specifically denoted otherwise with respect to particular embodiments. As used herein, the term "surface roughness" generally refers to a statistical expression of high-frequency deviations of surface height from a nominal baseline value, often a local mean surface height. The terms "surface roughness" and "roughness" are used interchangeably throughout the specification. As is well-known in the art, many different parameters may be used to describe the roughness of a given surface, and each of these parameters has advantages and disadvantages. Profile roughness parameters such as the arithmetic average of absolute values ($R_a$) and the root mean squared roughness ($R_q$) are commonly used parameters because they are readily measured using standard profilometry equipment and are easily calculated, though such measurements may not always provide the most useful description of a surface's roughness characteristics. Standard B46.1 of the American Society of Mechanical Engineers (ASME) provides procedures for measuring and calculating several different profile roughness parameters, including those noted above. Other types of roughness measures include parameters calculated over an area, as described in ISO 25178 published by International Organization for Standardization. Still other parameters are known and described in the literature.

For the purposes of the present description, "surface roughness" (and its abbreviated equivalent, "roughness") will be understood to include any one or more of these parameters, wherein a surface of interest on an article to be processed in accordance with the description herein is an "initial surface" and has a "roughness of the initial surface" prior to being exposed to the method, and a "processed surface" has a "roughness of the processed surface" after being exposed to the method. In one embodiment, the roughness parameter is a profile roughness parameter such as $R_a$. For example, in some embodiments, the surface of the article has a roughness of the initial surface of at least about 200 micro-inches (5 micrometers) $R_a$.

In accordance with embodiments of the described method, a surface of an article is modified by enriching it with aluminum to form a first aluminized layer and a sublayer, removing at least a portion of the first aluminized layer to expose the sublayer and aluminizing the sublayer at a second temperature to form a second aluminized layer, and finally removing at least a portion of the second aluminized layer to form a processed surface of the article. The first aluminized layer and the sublayer are formed by aluminizing an initial surface of the article at a first temperature and the second aluminized layer is formed by aluminizing the sublayer at a second temperature. The second temperature is less than the first temperature. Upon removal of the second aluminized layer, the roughness of the surface is reduced from a comparatively high roughness value of the initial surface to a comparatively low roughness value of the processed surface. In some embodiments, the roughness of the processed surface is less than about 95% of the roughness of the initial surface. Moreover, sequence of steps used to modify the surface roughness of the article as described herein may be iterated one or more times to achieve further reduction in the surface roughness. A combined thickness of the first aluminized layer and the sublayer may be comparable to the amount of material needed to be removed to achieve the desired reduction in surface roughness.

As used herein, a "surface" constitutes any portion of an article that is in contact with the ambient environment of that particular surface, and the term "substrate" encompasses the material underlying the surface. FIG. 1 illustrates a cross-sectional view of an illustrative article 100. The article 100 includes external and internal surfaces. By way of example, the article 100 includes external surfaces 102, 104, 106, 108, and also internal surfaces such as a channel wall 110 of an internal channel 112 disposed within the article 100. In certain embodiments, aluminizing a surface of the article 100 includes aluminizing both external and internal surfaces of the article 100. A substrate 101 is the quantity of material underlying any surface being treated in accordance with the described techniques, be it an external surface (such as surface 102) or internal surface such as channel wall 110 of the internal channel 112.

In some embodiments, at least a portion of the article—for example, substrate 101 includes additively manufactured material, that is, material disposed by an additive manufacturing technique. Typical additive manufacturing methods involve precise deposition of material (as by micro-pen deposition of a liquid followed by curing) or selective, localized densification of material (as by selective melting and solidification or sintering a powder, using a laser or other highly focused form of energy) to form a series of thin, cross-sectional slices, or layers, that in aggregate build a three-dimensional component. The layer formation generally is done in accordance with a computer-based model or other design model that describes the location and dimensions of internal and external surfaces of the article in three-dimensional space. One particular example is a process referred to in the art as direct metal laser melting (DMLM). The DMLM process uses a laser to melt and solidify a powdered starting material, layer-by-layer, into a three-dimensional object. Hence, an additively manufactured material may often be identified as a material comprising a series of layers of former powder particles that have been joined together by a sintering operation or, in most cases involving metal materials, a melt-and-solidification operation, associated with the additive manufacturing process. As used herein, "metal materials" include metallic alloys.

In some embodiments, the method described herein includes forming substrate 101 by a process that includes an additive manufacturing step. Substrate 101, when formed using one or more additive manufacturing processes, may have significant surface roughness caused, for example, by inclusion of incompletely melted metallic powder, or by contamination, debris, oxidation, melt pool instability, or other undesirable mechanisms that may occur as by-products of any of these various processes.

In some embodiments, the article 100 is a component of a turbine assembly. Examples of such components include components that include airfoil portions, such as rotor blades and stator vanes. Other examples include shafts, shrouds, fan components, compressor components, and combustion components. Various turbine assembly components often include internal channels, such as the channel 112, to facilitate flow of a fluid, including, for example, cooling air or, as another example, liquids such as coolants or fuel. Accordingly, the techniques described herein may be applied to external surfaces, internal surfaces, or both of these, occurring on or within such components.

Substrate 101 may comprise a metal, such as, but not limited to, cobalt, iron, nickel, aluminum, titanium, or any combination that includes one or more of these. In some embodiments, the initial surface is a cobalt-rich surface. As used herein, the term 'cobalt-rich surface' is a surface having at least 50 percent by weight of cobalt. In some embodiments, the composition of the substrate 101 includes at least 60 percent by weight cobalt. In certain embodiments, the composition of the substrate 101 includes at least 60 percent by weight cobalt. Examples of cobalt-bearing alloys that may benefit from the techniques described herein include, but are not limited to, cobalt-bearing alloys that include less than 25 percent by weight nickel, such as ASTM F75, Stellite® 21, Alloy L-605, MAR-M® 509, FSX-414, X-40, MULTIMET®, and Haynes® 188.

In some embodiments, the initial composition of the substrate 101 comprises an alloy comprising cobalt and chromium. An example of such an alloy includes an alloy that comprises from about 26 weight percent to about 30 weight percent chromium and from about 4 weight percent to about 7 weight percent molybdenum, with the balance comprising cobalt. Other alloying elements may be present as well. Other examples of suitable alloys for the substrate 101 include nickel-based superalloys, cobalt-based superalloys, iron-based superalloys, and other high temperature alloys that contain significant amounts of nickel, cobalt, and/or iron. An alloy is considered "high temperature" for the purposes of this description if the execution of the various steps described herein do not irreparably harm the properties of the substrate material, as by melting or partially melting the material, for example.

Figure 2:
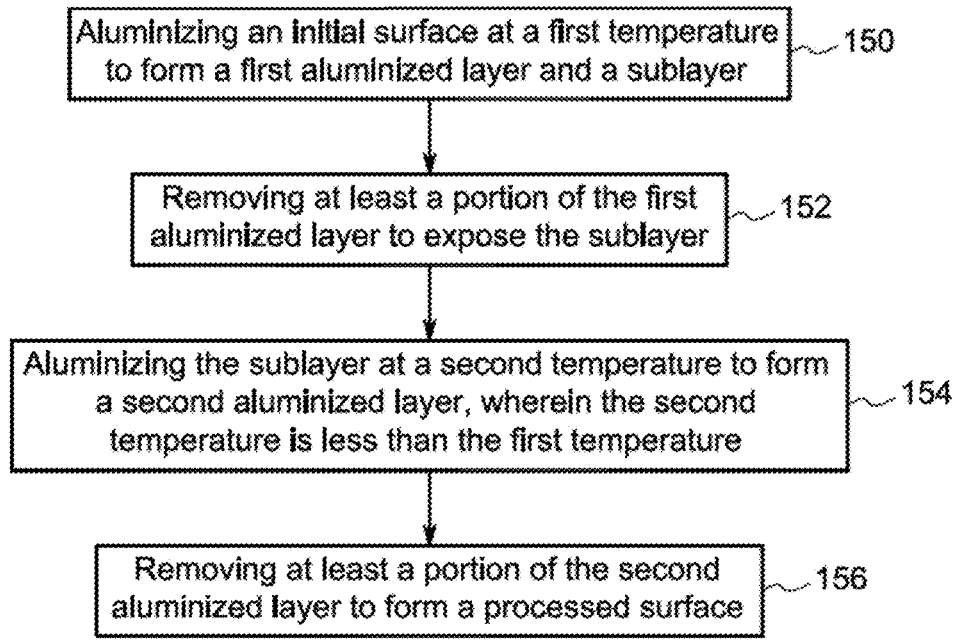
FIG. 2 is a process map of an illustrative method in accordance with some embodiments of techniques described herein.

FIG. 2 illustrates some steps of the method that can be used for reducing surface roughness of the article 1. The method includes aluminizing an initial surface of an article at a first temperature to form a first aluminized layer and a sublayer in step 150. The term "aluminizing" as used herein encompasses any process that results in the formation of aluminum-bearing material at or near the surface of a substrate. Any of various well-known methods for forming aluminum-bearing coatings on substrates may be suitable for use in this enriching step. For example, vapor-phase aluminizing (VPA) is a class of processes commonly used in the art to enrich the surface of high-temperature alloys with aluminum. VPA processes use a gaseous source of aluminum, such as an aluminum salt at high temperature, which reacts with the metal at the surface of the substrate to form aluminum. Other processes for aluminizing that may be employed in the method for reducing roughness of the article 100 may include slurry-based processes, in which an aluminum-bearing slurry is coated over the substrate surface, then heated to react the aluminum in the slurry with the surface of the substrate to form aluminide material. Other processes include deposition of an aluminum or aluminum-rich layer on the surface of the substrate, such as by sputtering or evaporation, followed by a heat treatment to diffuse the aluminum into the substrate, whereupon it reacts with substrate material to form an aluminide.

In some embodiments, regardless of the method or combination of methods used to dispose aluminum-bearing material on the initial surface, enriching the region with aluminum includes a heat treatment to diffuse and/or react aluminum with the initial surface. Elevated temperatures allow certain amount of inter-diffusion between the material being deposited and elements pertaining to the substrate. In certain embodiments, the heat-treating step is performed at pressures higher than the atmospheric pressure to prevent or stop diffusion-driven formation of voids, the voids may be formed as aluminum diffuses into the substrate. For example, in some embodiments, the method further comprises hot isostatic pressing (HIP) of the substrate. The HIP step may be done separately from the heat treatment, or the temperature and time of the HIP step may be selected to serve additionally as the heat treatment step. The pressure level used in the HIP step is typically greater than 10 ksi (about 70 MPa) at a temperature greater than 1000 degrees Celsius, for a time sufficient to achieve the goal of the step (i.e., close porosity to the extent desired, diffuse material to a desired depth, etc.). In an illustrative embodiment, the HIP step includes pressing the substrate at a temperature of 1200 degrees Celsius and pressure of 15 ksi (about 103 MPa) for about 4 hours.

Step 152 includes removing at least a portion of the first aluminized layer to expose the sublayer. Removal of material from the first aluminized layer may be performed using any of various well-known processes used to remove aluminide coatings from metal substrates. In some embodiments, the removal of the first aluminized layer is performed in a way that preferentially removes the first aluminized layer material but leaves the sublayer material beneath the first aluminized layer substantially intact and exposed to any further treatment.

In step 154, the method includes aluminizing the sublayer at a second temperature to form a second aluminized layer. The second temperature is less than the first temperature. The method includes removing at least a portion of the second aluminized layer in step 156 to form a processed surface. These steps are further discussed below for reducing a surface roughness of the article 100 (illustrated in FIG. 1) with the aid of FIGS. 3-7.

Figure 3:
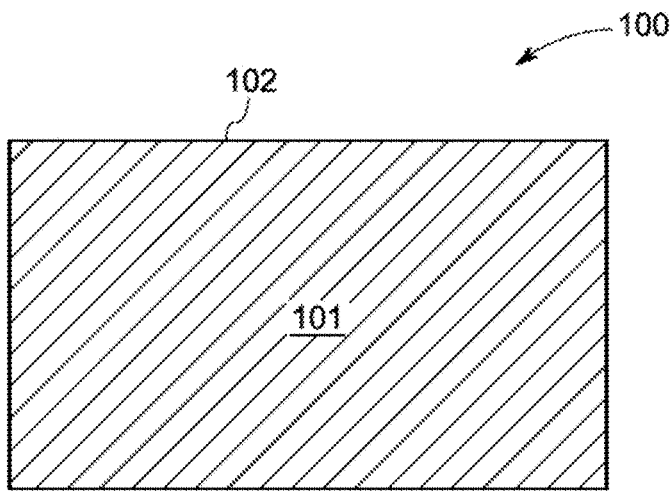
FIG. 3 is a schematic cross-sectional view of an illustrative initial article in accordance with some embodiments of techniques described herein.

FIG. 3 depicts a portion, such as substrate 101, of the article 100. An initial surface 102 of the substrate 101 is subjected to aluminizing. The initial surface 102, as noted previously, may be any external or internal surface of substrate 101. In some embodiments, the initial surface 102 is aluminized by coating the initial surface 102 with a first slurry. The first slurry includes both aluminum and aluminum oxide. In some embodiments, an amount of aluminum oxide in the first slurry is greater than 20 weight percentage of the first slurry. Without being limited by any theory, the aluminum oxide is included as an inert additive here and supposed to aid in adjusting the activity of aluminum during aluminizing at high temperatures.

The substrate 101 is heat treated to form a diffusion zone within the substrate; that is, aluminum is diffused into the substrate. The heat treatment temperature and time are selected to facilitate diffusion of aluminum into the substrate. In some embodiments, the temperature is at least about 900 degrees Celsius to provide a desirable level of thermal activation for the operative diffusion processes. Time period for maintaining the temperature at the thermal activation temperature is typically greater than an hour. It may be noted that lower values of thermal activation temperatures having relatively lower values require longer times to facilitate diffusion to a certain distance as compared to the higher values of the thermal activation temperatures. In an illustrative embodiment, the heat treatment step for aluminizing the initial surface 102 at first temperature includes heating the substrate to a temperature of about 1100 degrees Celsius for a time of about 8 hours.

Figure 4:
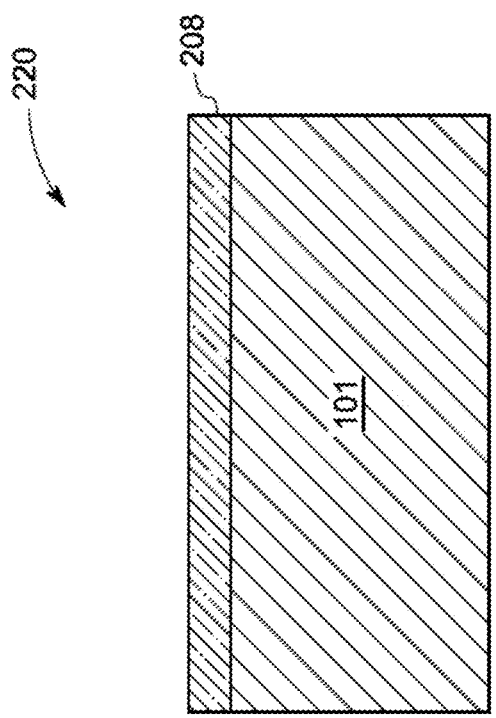
FIG. 4 is a schematic cross-sectional view of an illustrative intermediate article in accordance with some embodiments of techniques described herein.

FIG. 4 illustrates an intermediate article 200 formed by aluminizing the initial surface 102 of the substrate 101 illustrated in FIG. 2. The surface 102 of the substrate 101 is aluminized to form the intermediate article 200 such that there is a first aluminized layer 202 and a sublayer 204 on an unreacted bulk portion of the substrate 101. The unreacted bulk portion retains the initial composition of the substrate 101. In some embodiments, the sublayer 204 is in between a non-aluminized bulk portion of the substrate 101 and the first aluminized layer 202. The first temperature used for aluminizing the initial surface 102 may be greater than 1000 degrees Celsius. In some embodiments, the first temperature may be greater than 1200 degrees Celsius.

In the embodiments presented herein, the aluminized layer 202 may include more than one aluminide phases that are formed during the aluminizing step. For instance, the first aluminized layer 202 may include a cobalt-aluminum (e.g., $Co_3Al$) phase, a nickel-cobalt-aluminum (e.g., $(Ni,Co)_3Al$) phase, or a combination thereof near the surface 102 of the intermediate article 200, where aluminum activity is relatively high. Further, a very thin sublayer 204 of sigma phase, a mu phase, or a combination thereof forms further below the surface 102 of the intermediate article 200, where aluminum activity is relatively lower. The formulas provided here to describe the aluminide phases that form during aluminizing are nominal compositions. Those skilled in the art will appreciate that the aluminide phases may also include incidental quantities of other elements present in the substrate material, such as, but not limited to, tungsten.

Sigma and mu phases are topologically close packed phases, further defined by their crystal structure. A sigma phase typically has a topologically close packed (TCP) tetragonal crystal structure (e.g., $Co_{13}Cr_{13}$). A mu phase typically has a TCP rhombohedral structure (e.g., $(Co_7(Mo,W)_6)$. In some embodiments, the sublayer 204 includes a sigma phase. In some embodiments, more than 90 volume % of the sublayer contains sigma phase. In certain embodiments, sublayer is entirely formed of the sigma phase.

In some embodiments, thick first aluminized layer 202 is desirable for processing comparatively rougher surfaces, as the high thickness of the first aluminized layer aids in larger material removal of the rough surface. In some embodiments, the first aluminized layer 202 is formed within the substrate with a thickness $t_1$ of at least 70 micrometers below the surface 102, and in some embodiments this thickness is at least about 100 micrometers. In some embodiments, the thickness $t_1$ of the first aluminized layer 202 is in the range from about 100 micrometers to about 500 micrometers. In some embodiments, the sublayer 204 may have a thickness $t_2$ of at least 0.8 micrometer below the first aluminized layer 202. In some embodiments, the sublayer 204 may have a thickness $t_2$ that is less than 20 micrometers. In some embodiments, this thickness $t_2$ may be in a range from about 2-15 micrometers.

Figure 5:
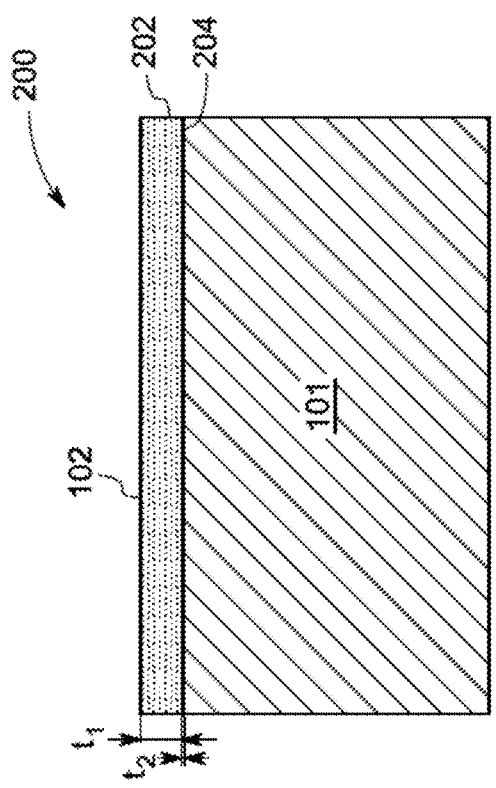
FIG. 5 is a schematic cross-sectional view of an illustrative intermediate article in accordance with some embodiments of techniques described herein.

After the first aluminized layer 202 and the sublayer 204 have been formed, at least a portion of the first aluminized layer 202 is removed, retaining at least a portion of the sublayer 204. In some embodiments, the removal of the first aluminized layer 202 is performed in a controlled manner. In some embodiments, the removal of the first aluminized layer is performed by controlling the removal of phases that have greater than 5 wt. % aluminum. In this way, the intermediate article 200 is altered to form another intermediate article 210 that includes the sublayer 204 present above the unreacted bulk portion of the substrate 101, as illustrated in FIG. 5. The intermediate article 210 has a surface 205 of the sublayer 204. A roughness value of the surface 205 of the sublayer 204 is less than the value of the roughness of the initial surface 102 (FIG. 3). In particular embodiments, substantially all of the first aluminized layer is removed.

Figure 6:
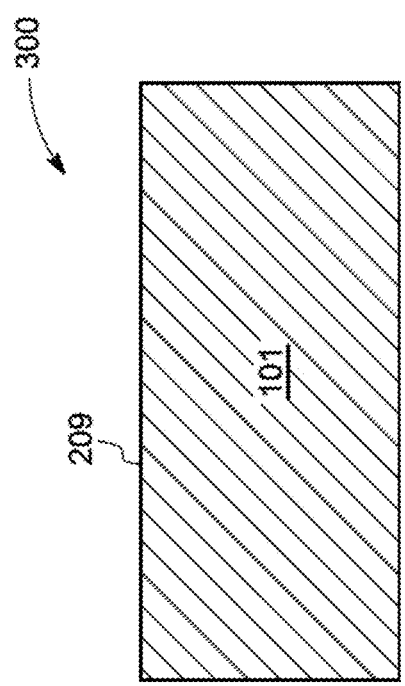
FIG. 6 is a schematic cross-sectional view of an illustrative intermediate article in accordance with some embodiments of techniques described herein.

Referring now to FIG. 6, an intermediate article 220 is formed by aluminizing the sublayer 204 (FIG. 5) after removal of the first aluminized layer 202 (FIG. 4). The sublayer 204 is aluminized at a second temperature to form the second aluminized layer 208 in the intermediate article 220. In some embodiments, aluminizing the sublayer 204 includes coating the sublayer with a second slurry. The second slurry includes aluminum. In some embodiments, an amount of aluminum oxide in the second slurry, if present, is less than 2 weight percentage of the second slurry. In some embodiments, the second slurry is free of aluminum oxide.

The second temperature used for aluminizing the sublayer 204 is lower than the first temperature that is used for forming the first aluminized layer 202 and the sublayer 204. In some embodiments, the second temperature is less than 800 degrees Celsius. In certain embodiments, the second temperature is less than 750 degrees Celsius. In some embodiments, the entire sublayer 204 is converted into the second aluminized layer 208.

Depending on the temperature and duration of applying the temperature to the sublayer 204, the thickness of the second aluminized layer 208 may be equal to or greater than the thickness of the previously present sublayer 204. This change in thickness of the second aluminized layer 208 may be a result of aluminization of the base metal of the substrate 101 to some extent. In some embodiments, the second aluminized layer 208 has a thickness $t_3$ of at least 20 micrometers, and in some embodiments this depth is at least about 40 micrometers. In some embodiments, the thickness $t_3$ of the second aluminized layer 208 is in a range from about 20 micrometers to about 80 micrometers. A composition of the second aluminized layer 208 is different from the composition of the sublayer 204. In some embodiments, the second aluminized layer 208 is richer in aluminum than the previously present sublayer 204. For example, the second aluminized layer 208 may include increased volume percentage of aluminum rich phases such as cobalt-aluminum, for example. It was experimentally found that the lower temperature of the second aluminization process reduces the propensity to form another sublayer between the second aluminized layer 208 and the unreacted bulk portion of the substrate 101. Depending on the aluminized phases present in the second aluminized layer 208, the second aluminized layer 208 may be formed as one layer or may contain more than one layers.

Figure 7:
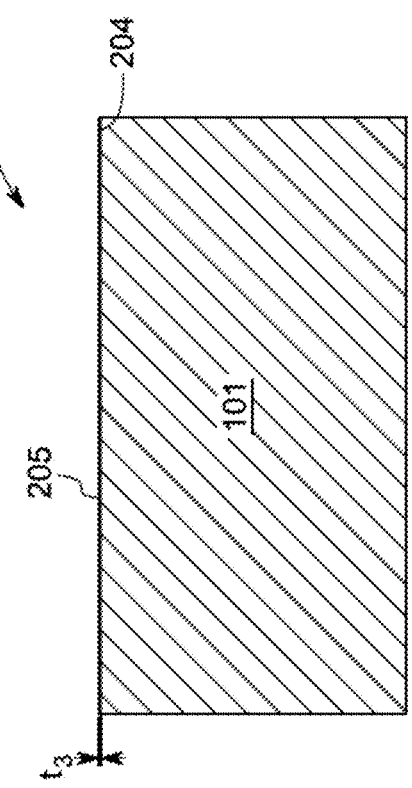
FIG. 7 is a schematic cross-sectional view of an illustrative processed article in accordance with some embodiments of techniques described herein.

After the formation of the second aluminized layer 208, at least a portion of the second aluminized layer 208 is removed to form a processed article 300 having a processed surface 209, as shown in FIG. 7. In some embodiments, the processed surface 209 is obtained after substantially removing the second aluminized layer 208. The roughness of the processed surface 209 is less than the roughness of the initial surface 102 and the roughness of the intermediate surface 205. In some embodiments, removing the first aluminized layer 202, removing the second aluminized layer 208, or removing both the first aluminized layer 202 and the second aluminized layer 208 includes acid etching. The acids used for the removal of the first aluminized layer may be equal to or different from the acid used for the removal of the second aluminized layer.

The two-step process used herein for aluminizing and removing the aluminized layers helps in greatly reducing the surface roughness of the initial article 100. In some embodiments, the roughness of the processed surface 209 is less than about 60% of the roughness of the initial surface 201. In some embodiments, the processed surface 209 is substantially similar in composition to the initial surface 201. In certain embodiments, the processed surface 209 is of the same composition as the initial surface 201.

In some embodiments, the processed surface may further be aluminized and subjected to etching to further smoothen the processed surface. The processed surface 209 may be aluminized by iterating one or more times the two-step processes described above, or by iterating the step of forming the second aluminized layer by aluminizing the processed surface 209 and removing the further aluminized layer. In the event of iterating only the second temperature for aluminizing the processed surface 209, the processed surface 209 is aluminized instead of a sublayer formed by the prior aluminizing step.

Figure 8:
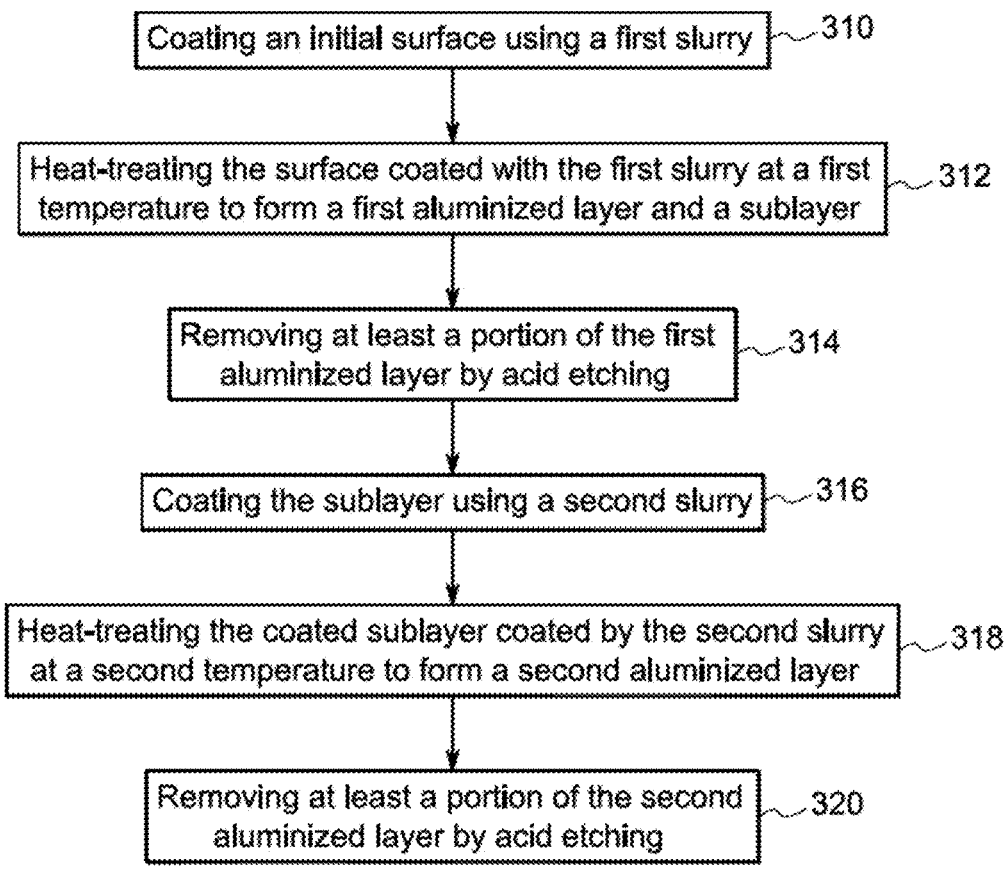
FIG. 8 is a process map of an illustrative method in accordance with some embodiments of techniques described herein.

In a particular embodiment, presented to further illustrate the techniques provided in this description, a method for reducing roughness of a surface includes the steps shown in FIG. 8. The step 310 includes coating an initial surface of a cobalt-bearing substrate using a first slurry to form a coated surface, step 312 includes heat-treating the coated surface at a first temperature to form a first aluminized layer and a sublayer, step 314 includes removing at least a portion of the first aluminized layer by acid etching, step 316 includes coating the sublayer using a second slurry to form a coated sublayer, step 318 includes heat-treating the coated sublayer at a second temperature to form a second aluminized layer, and the step 320 includes removing at least a portion of the second aluminized layer by acid etching to form a processed surface. Although the method used here is particularly advantageous for cobalt-bearing substrates, the benefits conferred by the present method are not limited to such substrate materials.

The step of removing at least a portion of the first aluminized layer by acid etching exposes the sublayer for the second aluminizing. The second temperature is less than the first temperature and a roughness of the processed surface is less than the roughness of the initial surface. In some embodiments, the first slurry includes aluminum, aluminum oxide, and ammonium chloride. In some embodiments, the second slurry used includes aluminum and ammonium chloride. In certain embodiments, the second slurry is free of aluminum oxide. In some embodiments, the first temperature is greater than 1000 degrees Celsius and the second temperature is less than 800 degrees Celsius.

Figure 9:
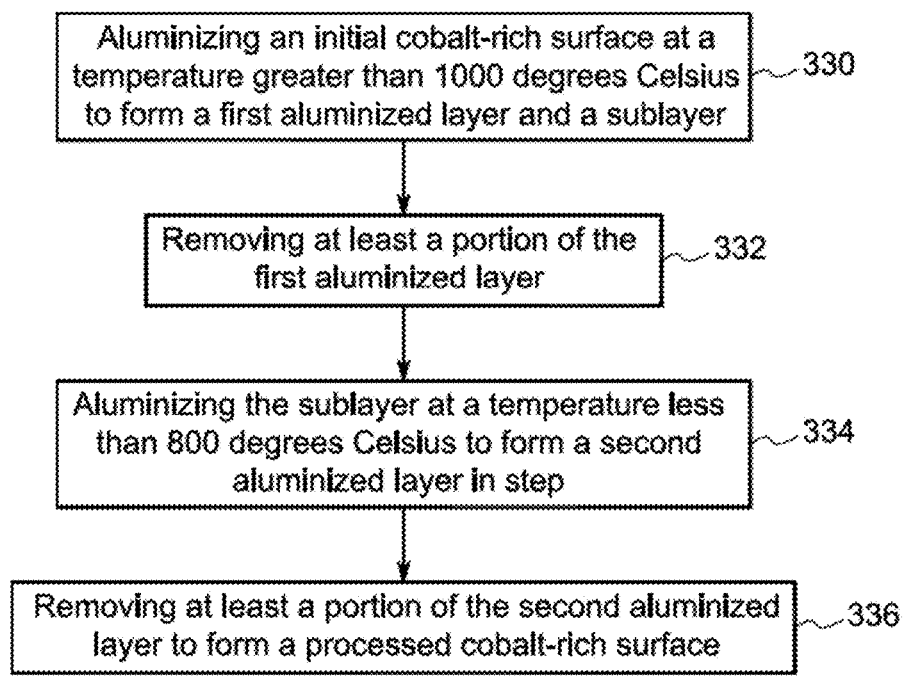
FIG. 9 is a process map of an illustrative method in accordance with some embodiments of techniques described herein.

In another particular embodiment, a method is disclosed as shown in FIG. 9. The method includes aluminizing an initial cobalt-rich surface at a temperature greater than 1000 degrees Celsius to form a first aluminized layer and a sublayer in step 330, removing at least a portion of the first aluminized layer in step 332, aluminizing the sublayer at a temperature less than 800 degrees Celsius to form a second aluminized layer in step 334, and removing at least a portion of the second aluminized layer to form a processed cobalt-rich surface in step 336. The initial cobalt rich surface may have an amount of cobalt that is greater than 60 atomic percentage of the initial cobalt-rich surface. As noted previously, a roughness of the processed cobalt-rich surface is less than the roughness of the initial cobalt-rich surface. Further the sequence of steps noted above may be iterated one or more times to achieve further reduction in substrate surface roughness.

EXAMPLES

The following examples are presented to further illustrate non-limiting embodiments of the present invention.

DMLM (direct metal laser melting) process was applied to make liquid fuel passage components of a gas turbine. A cobalt-based alloy tube coupon was used as a sample. As a result of the DMLM process, surface roughness was greater than a traditional machined surface.

Sample Preparation

The Co-based alloy sample is a tube with the size of OD ~5 mm, ID around 3 mm and length ~100 mm. The nominal chemical composition of the alloy included about 64 at. % of cobalt, about 31 at. % of chromium, about 4 at. % of molybdenum, about 0.5 at. % of carbon, and about 0.5 at. % of nitrogen.

Aluminizing

Aluminizing was carried out on a cleaned sample under different temperatures to meet different goals. Generally, thicker aluminized layers showed better surface finish improvements through creation of a larger diffusion layer. Aluminizing conditions were explored as a function of temperature, time and slurry composition. In a specific example, a first slurry composition was formed by mixing equal amounts of aluminum (Al) and aluminum oxide ($Al_2O_3$) along with less than 5% of ammonium chloride ($NH_4Cl$), and greater than 20% of ethylene glycol ($C_2H_6O_2$). The rough surfaces of the two Co-based samples were coated with the first slurry and then heat-treated in a furnace in the presence of argon. One sample was heated at 1080° C. for 2 hours and another sample was heated at 1080° C. for 4 hours. Intermediate temperatures aid in removal of ethylene glycol and reaction between Al and $NH_4Cl$ as shown below. Alumina in the powder form aids in tuning the activity of the slurry.

$$NH_4Cl = NH_3 + HCl \quad (1)$$

$$6HCl + 2Al = 2AlCl_3 + 3H_2 \quad (2)$$

Al and the formed $AlCl_3$ act as the sources of the activated aluminum under high temperature to form the reaction.

$$AlCl_3 + 2Al = 3AlCl \quad (3)$$

Figure 10:
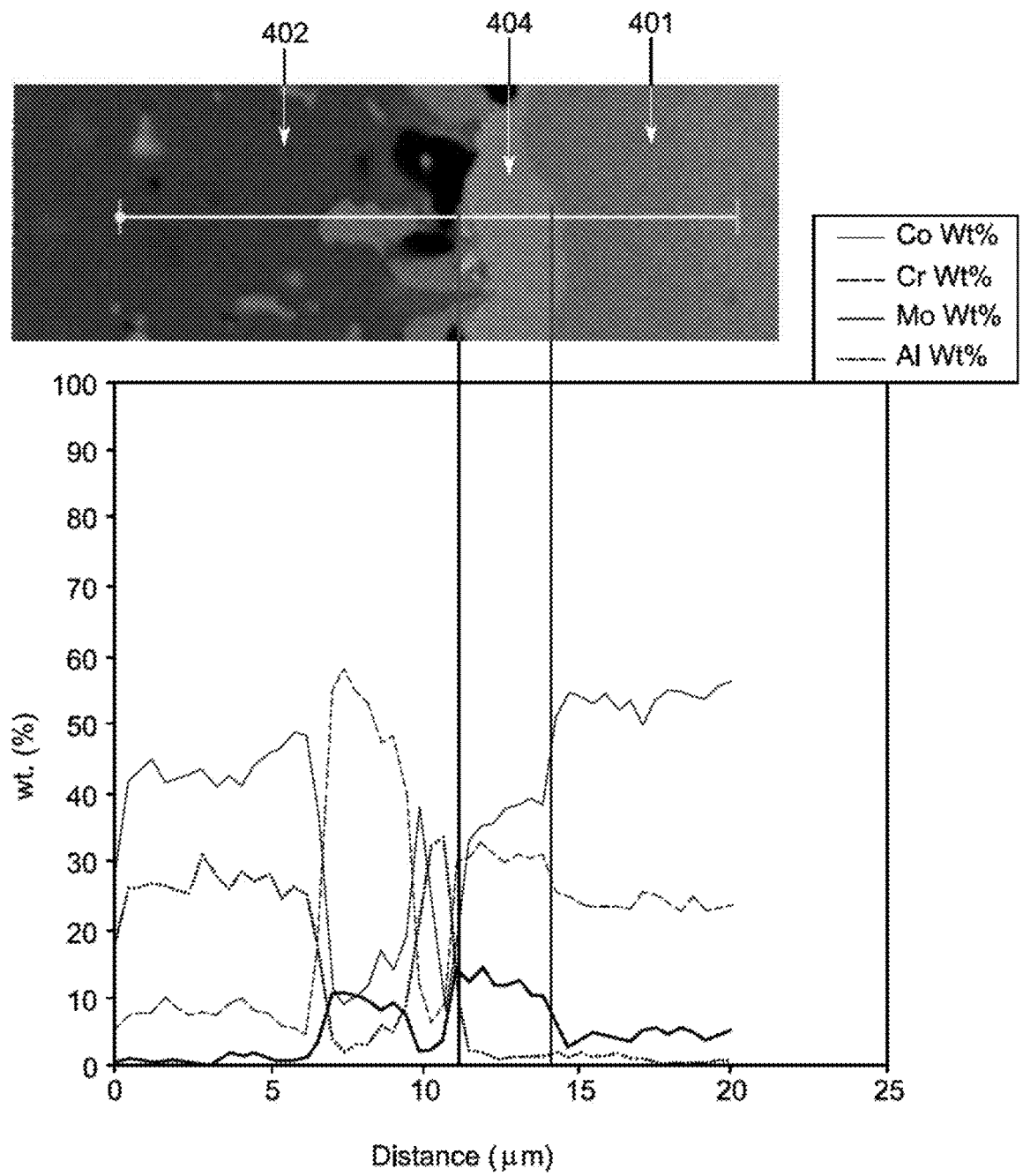
FIG. 10 is a cross-sectional scanning electron micrograph (SEM) view along with an associated energy dispersive spectroscopy (EDS) of an illustrative intermediate article in accordance with some embodiments of techniques described herein.

FIG. 10 illustrates scanning electron micrograph (SEM) view along with an associated energy dispersive spectroscopy (EDS) view of the cross section of the sample aluminized by heating for 2 hours at 1080 degrees Celsius. It can be seen that the sample has a bilayer structure for the aluminized region including a first aluminized layer 402 and a sublayer 404 over the base metal 401. The sublayer formed here was very thin, having a thickness less than 4 micrometers. Thickness of the coating layers could be tuned via the slurry composition, coating temperature, or time variations. Near-surface structure and element distribution of the samples were determined using EDS line scans, as shown in FIG. 10. It was seen that the aluminized layer 402 is formed of cobalt and aluminum and the sublayer 404 is of sigma phase having cobalt and chromium, formed at the interface between aluminized layer 402 and base metal 401.

Stripping

The coated and heat-treated tube samples were treated to remove the aluminide coating. $H_2SiF_6$ acid, $HNO_3$ and deionized water (di-$H_2O$) were mixed in equal volumes to prepare an aqueous solution and heated to 80 degrees Celsius. The coupons were immersed into the solution, then rinsed with di-$H_2O$.

Cross-sectional microstructures of the stripped samples were observed. SEM and EDS were performed to investigate the distribution of elements in the coated layer. Further, phase identification in the coated layer was probed using X-ray diffraction (XRD). The roughness of the surface was tested with three-dimensional (3D) laser scanning.

Figure 11:
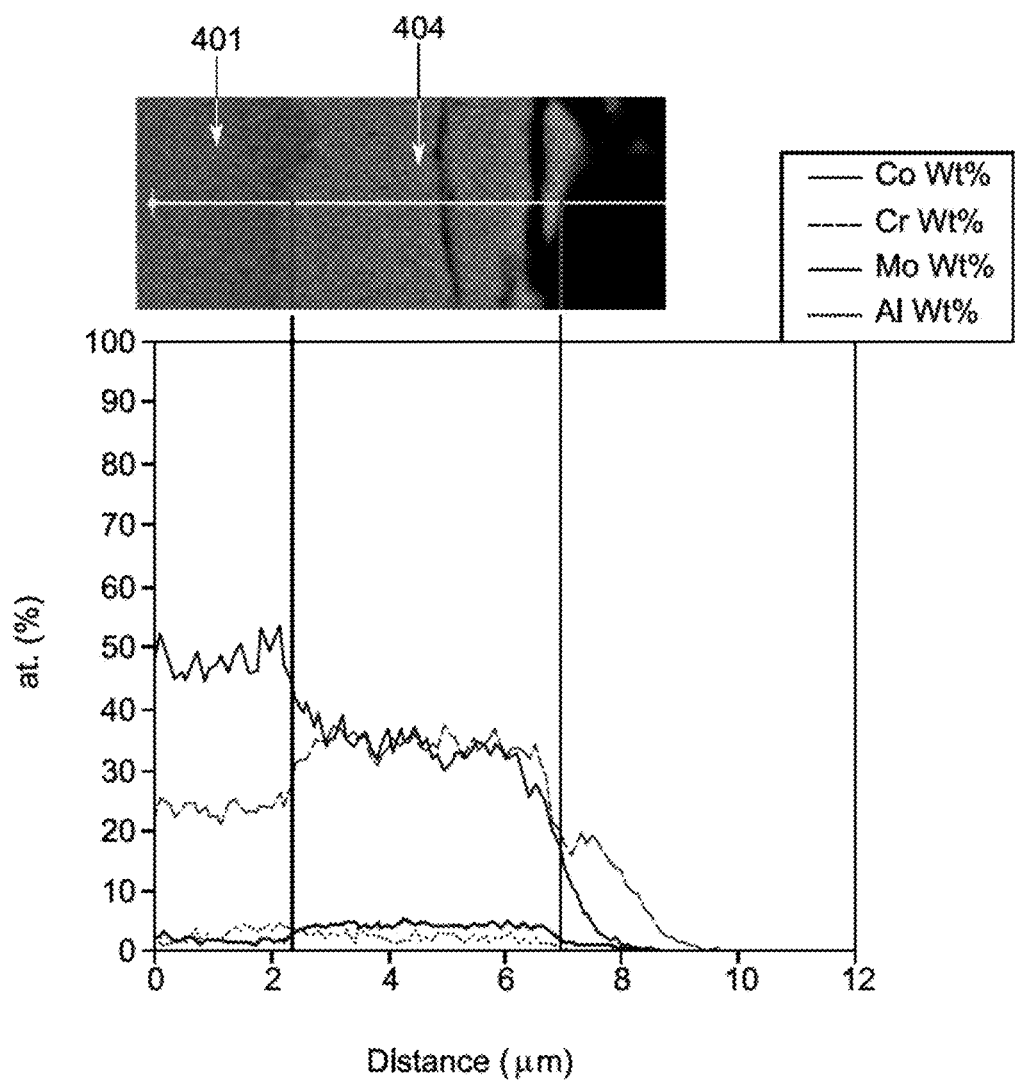
FIG. 11 is a cross-sectional SEM view along with an associated EDS of an illustrative intermediate article in accordance with some embodiments of techniques described herein.

FIG. 11 illustrates the SEM and EDS results of the cross section of the sample aluminized by heating for 2 hours at 1080 degrees Celsius, after stripping. It was observed that only the first aluminized layer 402 was stripped off and the sublayer 404 was exposed after stripping off the first aluminized layer 402. Though the surface of the sample was much smoother than the surface of the original sample, XRD analysis showed that the sublayer 404 was a sigma phase-rich layer. Sigma phase is likely to lead to poor mechanical performance of the part. An experiment to aluminize the sigma-phase containing sample was carried out.

Figure 12:
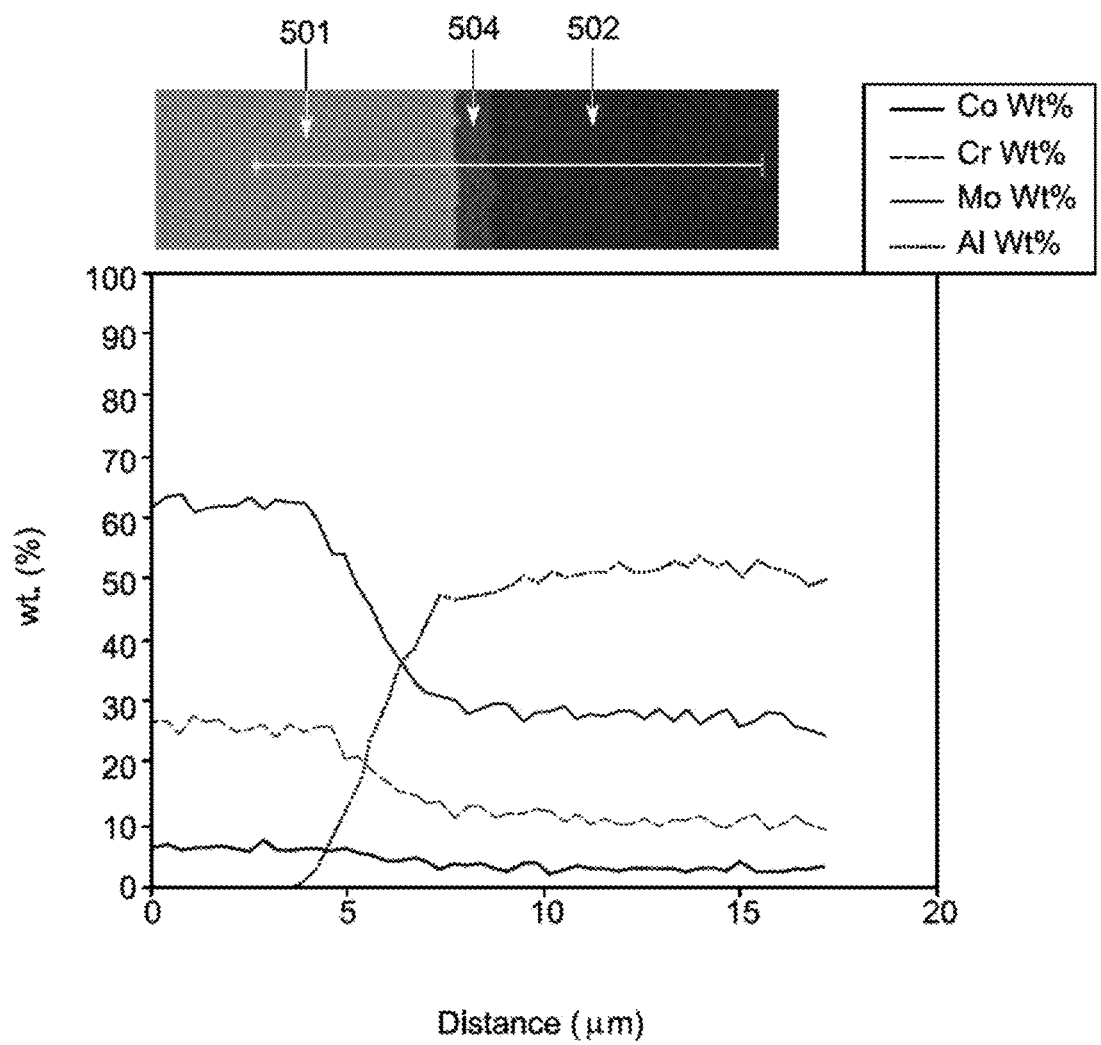
FIG. 12 is a cross-sectional SEM view along with an associated EDS of an illustrative intermediate article in accordance with some embodiments of techniques described herein.

In a specific example for the removal of the sublayer, a second slurry composition was formed by mixing aluminum (Al), ammonium chloride ($NH_4Cl$), and ethylene glycol ($C_2H_6O_2$). The surfaces of the samples having sigma phase sublayer surfaces were coated with the second slurry and then heat-treated in a furnace in the presence of argon. The samples were heated to 760 degrees Celsius for 8 hours. FIG. 12 illustrates the SEM and EDS results of the cross section of the sample after heating at 760° C. for 8 hours.

Figure 13:
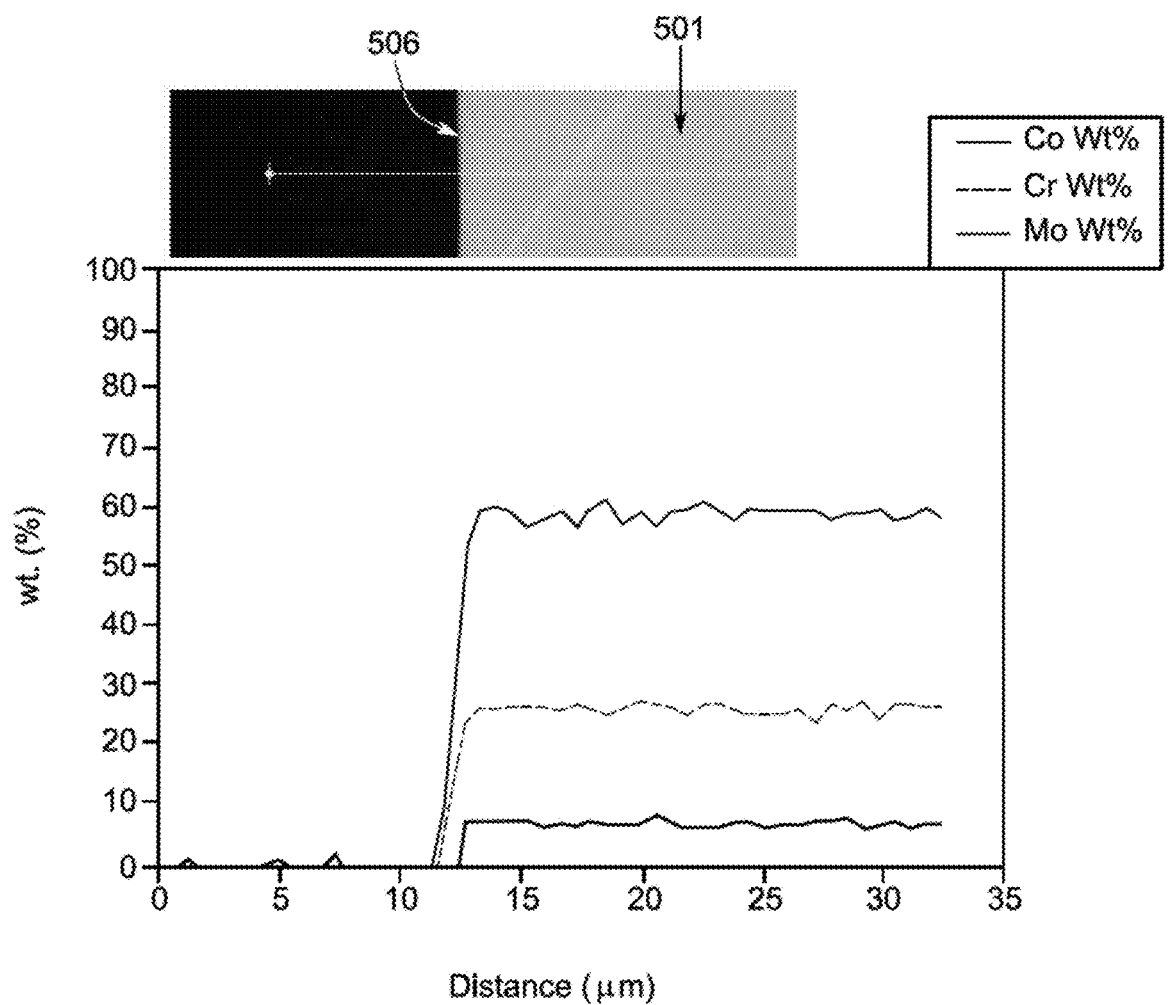
FIG. 13 is a cross-sectional SEM view along with an associated EDS of an illustrative processed article in accordance with some embodiments of techniques described herein.

Two second aluminized layers were seen in the microstructure, an aluminum-rich layer main layer 502 has cobalt, chromium, and molybdenum. A thin cobalt-aluminum, chromium intermediate layer 504 was seen in between the main layer 502 and the base metal 501. It was verified by XRD that the intermediate layer 504 does not contain any sigma phase or mu phase. Further, there were no sigma phase or mu phase formed in between the second aluminized layers (502 and 504) and the base metal 501, as verified by XRD. The layers were stripped off by acid etching as discussed above. FIG. 13 illustrates the SEM and EDS results of the cross section of the sample after stripping. After stripping, both the main layer 502 and the intermediate layer 504 were removed. The surface 506 of the sample obtained after stripping was the same as the base metal 501. The tube sample was axially cut into two pieces, namely downskin and bottom, for comparing the roughness of the original sample and the processed sample by the above-discussed two-step aluminizing and stripping process. For the downskin part, the surface roughness of the original sample was 40 μm. After the treatment, the surface roughness for the downskin part decreased to 21 μm, showing almost 50% improvement in smoothness of the surface. For the bottom part, the surface roughness was improved from 25 μm to 8 μm.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for reducing roughness of an initial surface, comprising:
   a. aluminizing the initial surface at a first temperature to form a first aluminized layer and a sublayer, wherein aluminizing the initial surface comprises coating the initial surface with a first slurry comprising aluminum and aluminum oxide;
   b. removing at least a portion of the first aluminized layer and the sublayer to expose at least a portion of the sublayer;
   c. aluminizing the sublayer at a second temperature to form a second aluminized layer, wherein the second temperature is less than the first temperature, wherein aluminizing the sublayer comprises coating the sublayer with a second slurry comprising aluminum, the second slurry free of aluminum oxide or containing an amount of aluminum oxide less than 2 weight percentage of the second slurry; and
   d. removing at least a portion of the second aluminized layer to form a processed surface, wherein a roughness of the processed surface is less than the roughness of the initial surface.

2. The method of claim 1, wherein a thickness of the first aluminized layer is greater than 100 micrometers.

3. The method of claim 1, wherein the sublayer is between a non-aluminized bulk portion and the first aluminized layer.

4. The method of claim 1, wherein the sublayer comprises a sigma phase.

5. The method of claim 1, wherein the first temperature is greater than 1000 degrees Celsius.

6. The method of claim 1, wherein the second temperature is less than 800 degrees Celsius.

7. The method of claim 1, wherein the initial surface is a cobalt-rich surface.

8. The method of claim 1, wherein an amount of the aluminum oxide in the first slurry is greater than 20 weight percentage of the first slurry.

9. The method of claim 1, wherein removing the first aluminized layer, removing the second aluminized layer, or removing both the first aluminized layer and the second aluminized layer comprises acid etching.

10. The method of claim 1, wherein the roughness of the processed surface is less than about 60% of the roughness of the initial surface.

11. The method of claim 1, further comprising iterating the steps a, b, c, and d.

12. A method for reducing roughness of an initial surface, comprising:
  a. coating an initial surface using a first slurry to form a coated surface, the first slurry comprising aluminum and aluminum oxide;
  b. heat-treating the coated surface at a first temperature to form a first aluminized layer and a sublayer;
  c. removing at least a portion of the first aluminized layer and the sublayer by acid etching to expose at least a portion of the sublayer;
  d. coating the sublayer using a second slurry to form a coated sublayer, the second slurry comprising aluminum, the second slurry free of aluminum oxide or containing an amount of aluminum oxide less than 2 weight percentage of the second slurry;
  e. heat-treating the coated sublayer at a second temperature to form a second aluminized layer, wherein the second temperature is less than the first temperature; and
  f. removing at least a portion of the second aluminized layer by acid etching to form a processed surface, wherein a roughness of the processed surface is less than the roughness of the initial surface.

13. The method of claim 12, wherein the first slurry further comprises ammonium chloride.

14. The method of claim 12, wherein the second slurry further comprises ammonium chloride.

15. The method of claim 12, wherein the first temperature is greater than 1000 degrees Celsius.

16. The method of claim 12, wherein the second temperature is less than 800 degrees Celsius.

17. A method for reducing roughness of an initial surface, comprising:
  a. aluminizing an initial cobalt-rich surface at a temperature greater than 1000 degrees Celsius to form a first aluminized layer and a sublayer, wherein aluminizing the initial cobalt-rich surface comprises coating the initial cobalt-rich surface with a first slurry comprising aluminum and aluminum oxide;
  b. removing at least a portion of the first aluminized layer and the sublayer to expose at least a portion of the sublayer;
  c. aluminizing the sublayer at a temperature less than 800 degrees Celsius to form a second aluminized layer, wherein aluminizing the sublayer comprises coating the sublayer with a second slurry comprising aluminum, the second slurry free of aluminum oxide or containing an amount of aluminum oxide less than 2 weight percentage of the second slurry; and
  d. removing at least a portion of the second aluminized layer to form a processed cobalt-rich surface, wherein a roughness of the processed cobalt-rich surface is less than the roughness of the initial cobalt-rich surface.

18. The method of claim 17, wherein an amount of cobalt in the initial cobalt-rich surface is greater than 60 atomic percentage.

* * * * *